US011848395B2

(12) United States Patent
Fang et al.

(10) Patent No.: US 11,848,395 B2
(45) Date of Patent: Dec. 19, 2023

(54) PREPARATION METHOD FOR BIFACIAL PERC SOLAR CELL

(71) Applicants: Guangdong Aiko Solar Energy Technology Co., Ltd., Guangdong (CN); ZHEJIANG AIKO SOLAR ENERGY TECHNOLOGY CO., LTD., Zhejiang (CN)

(72) Inventors: Jiebin Fang, Guangdong (CN); Kang-Cheng Lin, Guangdong (CN); Chun-Wen Lai, Guangdong (CN); Nailin He, Guangdong (CN); Wenjie Yin, Guangdong (CN); Ta-Neng Ho, Guangdong (CN); Gang Chen, Guangdong (CN)

(73) Assignees: Guangdong Aiko Solar Energy Technology Co., Ltd., Foshan (CN); ZHEJIANG AIKO SOLAR ENERGY TECHNOLOGY CO., LTD., Yiwu (CN)

( * ) Notice: Subject to any disclaimer, the term of this patent is extended or adjusted under 35 U.S.C. 154(b) by 547 days.

(21) Appl. No.: 17/128,459

(22) Filed: Dec. 21, 2020

(65) Prior Publication Data
US 2021/0226077 A1    Jul. 22, 2021

Related U.S. Application Data

(63) Continuation of application No. 16/345,751, filed as application No. PCT/CN2017/086030 on May 25, 2017, now abandoned.

(30) Foreign Application Priority Data
May 18, 2017   (CN) .......................... 201710353392.3

(51) Int. Cl.
*H01L 31/068*   (2012.01)
*C23C 16/30*   (2006.01)
(Continued)

(52) U.S. Cl.
CPC ........ *H01L 31/0684* (2013.01); *C23C 16/308* (2013.01); *C23C 16/345* (2013.01); *C23C 16/402* (2013.01); *C23C 16/403* (2013.01); *C23C 16/50* (2013.01); *C23C 16/54* (2013.01); *H01J 37/32743* (2013.01); *H01J 37/32899* (2013.01); *H01L 21/0217* (2013.01); *H01L 21/02164* (2013.01); *H01L 21/02178* (2013.01);
(Continued)

(58) Field of Classification Search
CPC ..... Y02E 10/547; Y02E 10/546; Y02E 10/52; H01L 31/0684; H01L 31/022425; H01L 31/022433; H01L 31/022441; H01L 31/0516; H01L 31/0488; H01L 31/02008; H01L 31/0201; H01L 31/18; H01L 31/1864
See application file for complete search history.

(56) References Cited

U.S. PATENT DOCUMENTS 10,964,828 B2 * 3/2021 Lin ...................... H01L 31/1868
2016/0240724 A1 * 8/2016 Boescke ............. H01L 31/0684
2016/0293785 A1 * 10/2016 Pei ....................... H01L 31/1804

* cited by examiner

*Primary Examiner* — Jose R Diaz

(57) ABSTRACT

The present invention discloses a method for preparing a bifacial PERC solar cell. The present invention has high photoelectric conversion efficiency, high appearance quality, and high EL yield, and could solve the problems of both scratching and undesirable deposition.

9 Claims, 5 Drawing Sheets

(51) Int. Cl.
*C23C 16/34* (2006.01)
*C23C 16/40* (2006.01)
*H01L 31/0224* (2006.01)
*H01L 31/0236* (2006.01)
*H01L 21/673* (2006.01)
*H01L 21/06* (2006.01)
*H01L 21/02* (2006.01)
*H01L 31/18* (2006.01)
*C23C 16/50* (2006.01)
*C23C 16/54* (2006.01)
*H01J 37/32* (2006.01)
*H01L 21/677* (2006.01)
*H01L 21/67* (2006.01)

(52) U.S. Cl.
CPC ...... *H01L 21/673* (2013.01); *H01L 21/67265* (2013.01); *H01L 21/67294* (2013.01); *H01L 21/67754* (2013.01); *H01L 21/67763* (2013.01); *H01L 31/02363* (2013.01); *H01L 31/022425* (2013.01); *H01L 31/186* (2013.01); *H01L 31/1876* (2013.01); *H01L 21/02274* (2013.01)

PREPARATION METHOD FOR BIFACIAL PERC SOLAR CELL

CROSS-REFERENCE TO RELATED APPLICATIONS

This application is a continuation of U.S. application Ser. No. 16/345,751, filed Apr. 29, 2019, which is a U.S. national stage application of the International Patent Application No. PCT/CN2017/086030, filed May 25, 2017, which claims the benefit of Chinese Patent Application No. 201710353392.3, filed May 18, 2017, all of which are incorporated herein by reference in their entireties.

FIELD OF THE INVENTION

The present invention relates to the field of solar cells, and in particular to a bifacial tube-type PERC solar cell, a preparation method thereof, and production device therefor.

BACKGROUND OF THE INVENTION

A crystalline silicon solar cell is a device that effectively absorbs solar radiation energy and converts light energy into electrical energy through the photovoltaic effect. When sunlight reaches the p-n junction of a semiconductor, new electron-hole pairs are formed. Under the action of the electric field at the p-n junction, the holes flow from the N zone to the P zone, and the electrons flow from the P zone to the N zone, generating current in a connected circuit.

In a conventional crystalline silicon solar cell, surface passivation is basically only performed at the front surface, which involves depositing a layer of silicon nitride on the front surface of the silicon wafer via PECVD to reduce the recombination rate of the minority carriers at the front surface. As a result, the open-circuit voltage and short-circuit current of the crystalline silicon solar cell are greatly increased, which leads to an increase of the photoelectric conversion efficiency of the crystalline silicon solar cell.

In order to meet the ever-rising requirements for the photoelectric conversion efficiency of crystalline silicon cells, people began to study the rear surface passivation of solar cells. At present, the mainstream method is to use a plate PECVD system to coat the rear side. The plate PECVD system consists of different chambers; each chamber coats one film. Once the device is fixed, the number of layers of a composite film is fixed. Therefore, a disadvantage of the plate PECVD system is that the combination of layers in the composite film cannot be flexibly adjusted; thus, it is impossible to optimize the passivation effect of the rear surface film, which limits the photoelectric conversion efficiency of the battery. In addition, the plate PECVD system employs an indirect plasma method, which gives a less than ideal passivation effect of the film. The plate PECVD system also has other disadvantages including low uptime and long maintenance time, which affects its capacity and yield.

The present invention employs tubular PECVD technology to deposit a composite film on the rear surface of a silicon wafer in order to produce a bifacial high-efficiency PERC solar cell. Due to the fact that tubular PECVD technology adopts a direct plasma method and could flexibly adjust the composition and combination of layers in a composite membrane, the passivation effect of the film is good; the photoelectric conversion efficiency of the PERC solar cell can be significantly improved. The excellent passivation ability and process flexibility of tubular PECVD technology allow the thickness of an aluminum oxide film to be reduced, thus reducing the consumption of TMA. In addition, tubular PERC technology can be easily maintained and has a high uptime. In view of the above, employing tubular PECVD technology to produce high-efficiency PERC cells has a significant overall cost advantage over employing plate PECVD technology.

Despite the above, the cells produced by tubular PECVD technology have poor appearance quality and low electroluminescence (EL) yield due to contradictive problems of undesirable deposition and scratching; these drawbacks prevent the application of this technology in mass production.

In a tubular PECVD coating equipment, a silicon wafer is first inserted into a graphite boat, and then the graphite boat is fed into a quartz tube for coating deposition. In the graphite boat, the silicon wafer is fixed to the graphite boat wall via three pins; one side of the silicon wafer is in contact with the graphite boat wall, and a film is deposited on the other side of the silicon wafer. To allow the formation of a uniform film, the silicon wafer should be in tight contact with the graphite boat wall. Therefore, the width of the pin slot is set to be small; about 0.25 mm. There are two advantages in deposition employing tubular PECVD: 1. during the insertion process, the silicon wafer slides against the graphite boat wall and scratches the surface of the silicon wafer which is adjacent to the graphite boat wall; 2. during the deposition process, due to the inevitable presence of a gap between the silicon wafer and the graphite boat wall (and in particular a large gap at the position of the pins), the reacting gas would diffuse to the other surface of the silicon wafer and deposits at the other side, leading to undesirable deposition; hence, undesirable deposition is more serious at the pins.

When using tubular PECVD to coat the front surface of a conventional solar cell, scratching and undesirable deposition do not affect the quality of the cell product; the reasons are as follows: 1. there are no p-n junctions and coating on the rear surface of the silicon wafer, hence scratches would not affect the electrical performance and the EL yield of the cell; 2. there is no coating on the rear surface of the silicon wafer, hence the relatively thin undesirable deposition on the rear surface does not appear obvious and does not affect the appearance quality of the cell.

On the other hand, when using tubular PECVD to form the rear surface film of a PERC cell, scratching and undesirable coating would seriously affect the pass rate of the cell product. The problems are as follows: 1. during the deposition of the rear surface film, undesirable coating would take place at the edges of the front surface of the cell. As the PERC cell is coated on both sides, the coating at the edges of the front surface would be relatively thick; consequentially, graphite boat marks and color difference appear at the edges of the front surface of the cell, affecting the appearance quality; 2. when being inserted into the graphite boat, the front surface of the silicon wafer would be in contact with the graphite boat wall, scratching the p-n junctions at the front surface; as a result, scratches would be present during the EL test, and the electrical performance of the cell would be affected.

SUMMARY OF THE INVENTION

The objective of the present invention is to provide a bifacial tube-type PERC solar cell which can absorb sunlight on both surfaces, has high photoelectric conversion efficiency, high appearance quality, and high EL yield, and could solve the problems of both scratching and undesirable deposition.

Another objective of the present invention is to provide a method of preparing the bifacial tube-type PERC solar cell, which is simple, can be carried out at a large scale, and is compatible with existing production lines. The solar cells produced have high appearance quality and high EL yield, and could solve the problems of both scratching and undesirable deposition.

Yet another objective of the present invention is to provide a device for producing the bifacial tube-type PERC solar cell. The device has a simple structure, is able to lower production cost, and has large capacity and yield. The solar cells produced have high appearance quality and high EL yield, and could solve the problems of both scratching and undesirable deposition.

To achieve the first objective above, the present invention provides a bifacial tube-type PERC solar cell, wherein it comprises a rear silver major grid line, a rear aluminum grid line, a rear surface composite film, P-type silicon, an N-type emitter, a front surface silicon nitride film, and a front silver electrode; the rear surface composite film, the P-type silicon, the N-type emitter, the front surface silicon nitride film, and the front silver electrode are stacked and connected sequentially from bottom to top;

the rear surface composite film includes one or more films selected from a group comprising an aluminum oxide film, a silicon dioxide film, a silicon oxynitride film, and a silicon nitride film; it is deposited at a rear surface of a silicon wafer by a tubular PECVD device; the tubular PECVD device is provided with four gas lines of silane, ammonia, trimethyl aluminum, and nitrous oxide; the four gas lines are used alone or in combination to form the aluminum oxide film, the silicon dioxide film, the silicon oxynitride film, and the silicon nitride film; a graphite boat is employed to load and unload the silicon wafer in the tubular PECVD device; a pin slot of the graphite boat has a depth of 0.5-1 mm;

the rear surface composite film forms 30-500 parallel-arranged laser grooving regions by laser grooving; each laser grooving region includes at least 1 set of laser grooving unit; the rear aluminum grid line is connected to the P-type silicon via the laser grooving regions; the rear aluminum grid line is perpendicularly connected to the rear silver major grid line.

As an improvement of the technical solution above, the pin slot of the graphite boat has a depth of 0.6-0.8 mm; a diameter of a pin base is 6-15 mm, an angle of inclination of an inclined surface of a pin cap is 35-45 degrees; a thickness of the pin cap is 1-1.3 mm.

As an improvement of the technical solution above, 3-5 pin marks are formed on the rear surface of the bifacial tube-type PERC solar cell.

As an improvement of the technical solution above, a bottom layer of the rear surface composite film is the aluminum oxide film, and a top layer is composed of one or more films selected from a group consisting of the silicon dioxide film, the silicon oxynitride film, and the silicon nitride film.

As an improvement of the technical solution above, a bottom layer of the rear surface composite film is a silicon dioxide film; a middle layer of the rear surface composite film is the aluminum oxide film; a top layer is composed of one or more films selected from a group consisting of the silicon dioxide film, the silicon oxynitride film, and the silicon nitride film.

As an improvement of the technical solution above, a thickness of the aluminum oxide film is 5-15 nm, a thickness of the silicon nitride film is 50-150 nm, a thickness of the silicon oxynitride film is 5-20 nm, and a thickness of the silicon dioxide film is 1-10 nm.

Accordingly, the present invention also provides a method of preparing the bifacial tube-type PERC solar cell, wherein it comprises the following steps:

S101: forming a textured surface on a front surface and a rear surface of the silicon wafer, the silicon wafer is the P-type silicon;

S102: performing diffusion on the silicon wafer to form the N-type emitter;

S103: removing phosphosilicate glass and peripheral p-n junctions formed during the diffusion; polishing the rear surface of the silicon wafer; the depth of rear surface etching is 3-6 μm;

S104: performing annealing on the silicon wafer; an annealing temperature is 600-820° C., a nitrogen flow rate is 1-15 L/min, and an oxygen flow rate is 0.1-6 L/min;

S105: depositing the rear surface composite film on the rear surface of the silicon wafer, including the following:

depositing the aluminum oxide film using TMA and $N_2O$; a gas flow rate of TMA is 250-500 sccm, a gas flow ratio of TMA to $N_2O$ is 1 to 15-25; a plasma power is 2000-5000 W;

depositing the silicon oxynitride film using silane, ammonia, and nitrous oxide; a gas flow rate of silane is 50-200 sccm, a gas flow ratio of silane to nitrous oxide is 1 to 10-80; a gas flow rate of ammonia is 0.1-5 slm, the plasma power is 4000-6000 W;

depositing the silicon nitride film using silane and ammonia; the gas flow rate of silane is 500-1000 sccm; a gas flow ratio of silane to ammonia is 1 to 6-15; a deposition temperature of the silicon nitride film is 390-410° C.; a deposition time is 100-400 s; the plasma power is 10000-13000 W;

depositing a silicon dioxide film using nitrous oxide; a gas flow rate of nitrous oxide is 0.1-5 slm; the plasma power is 2000-5000 W;

the tubular PECVD device is provided with four gas lines of silane, ammonia, trimethyl aluminum, and nitrous oxide; the graphite boat is employed to load and unload the silicon wafer in the tubular PECVD device; the pin slot of the graphite boat has a depth of 0.5-1 mm;

S106: depositing a passivation film on the front surface of the silicon wafer;

S107: performing laser grooving at the rear surface of the silicon wafer;

wherein a laser wavelength is 532 nm, a laser power is above 14 W, a laser scribing speed is above 12 m/s, and a frequency is above 500 kHZ;

S108: printing with a paste for the rear silver major grid line on the rear surface of the silicon wafer; drying;

S109: printing with aluminum paste at the laser grooving regions to perpendicularly connect with the paste for the rear silver major grid lines;

S110: printing with positive electrode slurry on the front surface of the silicon wafer;

S111: sintering the silicon wafer at a high temperature to form the rear silver major grid line, the rear aluminum grid lines, and the front silver electrode;

S112: performing anti-LID annealing on the silicon wafer to obtain the bifacial tube-type PERC solar cell.

As an improvement of the technical solution above, depositing the rear surface composite film on the rear surface of the silicon wafer includes the following:

depositing the aluminum oxide film using TMA and N₂O; the gas flow rate of TMA is 250-500 sccm, the ratio of TMA to N₂O is 1 to 15-25; the plasma power is 2000-5000 W;

depositing the silicon oxynitride film using silane, ammonia, and nitrous oxide; the gas flow rate of silane is 50-200 sccm, the ratio of silane to nitrous oxide is 1 to 10-80; the gas flow rate of ammonia is 0.1-5 slm, the plasma power is 4000-6000 W;

depositing the silicon nitride film using silane and ammonia; the gas flow rate of silane is 500-1000 sccm; the ratio of silane to ammonia is 1 to 6-15; the deposition temperature of the silicon nitride film is 390-410° C.; the deposition time is 100-400 s; the plasma power is 10000-13000 W;

depositing a silicon dioxide film using nitrous oxide; the gas flow rate of nitrous oxide is 0.1-5 slm; the plasma power is 2000-5000 W.

Accordingly, the present invention also provides a production device for the bifacial tube-type PERC solar cell, the device is the tubular PECVD device, which includes a silicon wafer loading area, a furnace body, a gas cabinet, a vacuum system, a control system, and a graphite boat; the gas cabinet is provided with a first gas line for silane, a second gas line for ammonia, a third gas line for trimethylaluminum, and a fourth gas line for nitrous oxide;

the graphite boat is employed for loading and unloading the silicon wafer; the graphite boat includes a pin, and the pin includes a pin shaft, a pin cap, and a pin base; the pin shaft is mounted on the pin base; the pin cap is connected to the pin shaft; the pin slot is formed between the pin shaft, the pin cap, and the pin base; the depth of the pin slot is 0.5-1 mm.

As an improvement of the technical solution above, the depth of the pin slot is 0.6-0.8 mm; a diameter of the pin base is 6-15 mm; an angle of inclination of an inclined surface of the pin cap is 35-45 degrees; a thickness of the pin cap is 1-1.3 mm.

The present invention has the following beneficial effects:

First, the bifacial tube-type PERC solar cell of the present invention has a plurality of aluminum grid lines arranged in parallel at the rear surface of the cell. These aluminum grid lines not only replace the aluminum back surface field in an existing monofacial solar cell and allows light absorption on the rear surface, but also act as minor grid lines of a rear silver electrode for electron conduction. The bifacial tube-type PERC solar cell of the present invention not only lowers production cost by reducing the amount of silver paste and aluminum paste used, but also allows light absorption on both surfaces, which significantly expands the scope of application and improves the photoelectric conversion efficiency of a solar cell.

Second, the present invention employs a tubular PECVD device to deposit the rear surface composite film on the rear surface of the silicon wafer in order to produce the aforementioned bifacial PERC solar cell provided with aluminum grid lines. The rear surface composite film includes one or more films selected from the group comprising an aluminum oxide film, a silicon dioxide film, a silicon oxynitride film, and a silicon nitride film, and is deposited at the rear surface of the silicon wafer by a tubular PECVD device. The tubular PERC device adopts a direct plasma method in which the plasma directly bombards the surface of the silicon wafer and causes significant passivation of the layer. The tubular PECVD device is provided with four gas lines of silane, ammonia, trimethyl aluminum, and nitrous oxide; the four gas lines are used alone or in combination to form the aluminum oxide film, the silicon dioxide film, the silicon oxynitride film, and the silicon nitride film. By adjusting the ratio of the gas flow of the four gas lines, it is possible to obtain different films. In particular, it is possible to obtain a silicon oxynitride film or a silicon nitride film having different composition ratios and refractive indexes by adjusting the ratio of the gas flow. The combination order, thickness, and composition of the composite film can be flexibly adjusted, and therefore the production process of the present invention is flexible and controllable; furthermore, it is possible to reduce cost and obtain a large yield with this production process. In addition, the rear surface composite film is optimized to match the rear aluminum grid lines, which gives the best passivation effect and significantly increases the photoelectric conversion efficiency of the PERC cell.

Third, the present invention adjusts the diameters of the pin shaft and the pin base to reduce the depth of the inside of the pin slot. As a result, the gap between the silicon wafer and the pin base at the position of the pins is reduced; consequentially, the amount of gas reaching and coating the rear surface of the silicon wafer is reduced, boat marks at the front surface edges of the cell are thus much less likely to occur. In addition, the present invention adequately increases the angle of inclination of the inclined surface of the pin cap and the thickness of the pin cap, and adjusts the automatic wafer inserter, thereby slightly increasing the distance between the silicon wafer and the graphite boat wall, reducing scratching. Increasing the angle of inclination of the inclined surface of the pin cap also reduces the impact force on the silicon wafer from the graphite boat when the silicon wafer is sliding down the inclined surface, reducing breakage rate.

Furthermore, silicon nitride is the outer layer of the rear surface composite film; as the deposition time increases, the thickness of the film increases, which causes silicon wafer to bend. In the present invention, the silicon nitride deposition temperature is limited to 390-410° C., the deposition time is limited to 100-400 s. By shortening the time and temperature of silicon nitride deposition, the bending of the silicon wafer can be reduced, and thus the amount of the undesirable coating can be reduced. The temperature window for silicon nitride deposition is very narrow, between 390-410 degrees; this temperature allows the maximum reduction of the undesirable coating. When the temperature is further lowered, however, the amount of the undesirable coating increases.

To meet the requirements of large-scale production and minimize the negative impact caused by shortening the silicon nitride deposition time, the present invention maintains a laser power of above 14 W, a laser scribing speed of above 12 m/s, and a frequency of above 500 kHZ. This allows the absorption of a sufficiently large amount of laser energy in per unit area of the rear surface composite film to effectively groove the composite film; as a result, the aluminum paste subsequently printed is in contact with the silicon substrate through the laser grooving regions.

To conclude, the bifacial tube-type PERC solar cell of the present invention can absorb sunlight on both surfaces. It has high photoelectric conversion efficiency, high appearance quality, and high EL yield; it solves the problems of both scratching and undesirable deposition. In addition, the present invention also provides a method and a device for the production of the aforementioned cell. The production method of the present invention is simple, can be carried out at a large scale, and is compatible with existing production lines. The device has a simple structure, is able to lower production cost, and has large capacity and yield.

DETAILED DESCRIPTION OF THE ILLUSTRATED EMBODIMENTS

To more clearly illustrate the objectives, technical solutions and beneficial of the present invention, the present invention will be further described in detail with reference to the accompanying drawings.

An existing monofacial solar cell has an aluminum back surface field on the rear surface of the cell and covering the entire rear surface of the silicon wafer. The aluminum back surface field increases the open-circuit voltage Voc and the short-circuit current Jsc, forces the minority carriers away from the surface, decreases the recombination rate of the minority carriers, leading to increased cell efficiency. However, as the aluminum back surface field is opaque, the rear surface of the solar cell, which is provided with the aluminum back surface field, cannot absorb light energy; light energy can only be absorbed in the front surface. Consequentially, it is difficult to significantly improve the overall photoelectric conversion efficiency of the cell.

Figure 1:
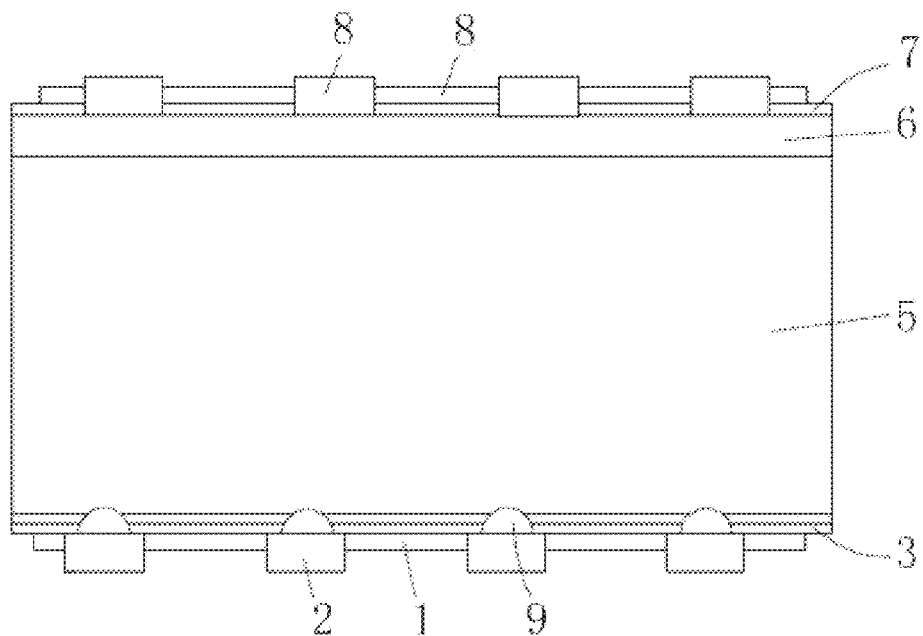
FIG. 1 is a sectional view of the bifacial tube-type PERC solar cell of the present invention.

In view of the technical problems above, referring to FIG. 1, the present invention provides a bifacial tube-type PERC solar cell, which consecutively includes a rear silver major grid line 1, rear aluminum grid lines 2, a rear surface composite film 3, P-type silicon 5, an N-type emitter 6, a front surface silicon nitride film 7, and a front silver electrode 8. The rear surface composite film 3, the P-type silicon 5, the N-type emitter 6, the front surface silicon nitride film 7, and the front silver electrode 8 are stacked and connected sequentially from bottom to top.

The rear surface passivation layer forms 30-500 groups of parallel-arranged laser grooving regions by laser grooving. Each laser grooving region includes at least 1 set of laser grooving unit 9. The rear aluminum grid lines 2 are connected to the P-type silicon 5 via the laser grooving regions. The rear aluminum grid lines 2 are perpendicularly connected to the rear silver major grid line 1.

The present invention improves on the basis of existing monofacial PERC solar cells. A plurality of rear aluminum grid lines 2 are provided instead of an aluminum back surface field. Laser grooving regions are formed at the rear surface composite film 3 by laser grooving, and rear aluminum grid lines 2 are printed on these parallel-arranged laser grooving regions to be in local contact with the P-type silicon 5. The closely and parallelly arranged rear aluminum grid lines 2 could increase the open-circuit voltage Voc and the short-circuit current Jsc, reduce the recombination rate of the minority carriers, thus increase the photoelectric conversion efficiency of the cell; they could replace the aluminum back surface field of the existing monofacial cell. In addition, the rear aluminum grid lines 2 do not completely cover the rear surface of the silicon wafer, and thus sunlight could reach the inside of the silicon wafer through the gaps between the rear aluminum grid lines 2. In this way, it is possible to achieve the absorption of light energy at the rear side of the silicon wafer, which greatly improves the photoelectric conversion efficiency of the cell.

Preferably, the number of the rear aluminum grid lines 2 is equal to the number of laser grooving regions and are both 30-500. More preferably, the number of the rear aluminum grid lines 2 is 80-220.

Figure 2:
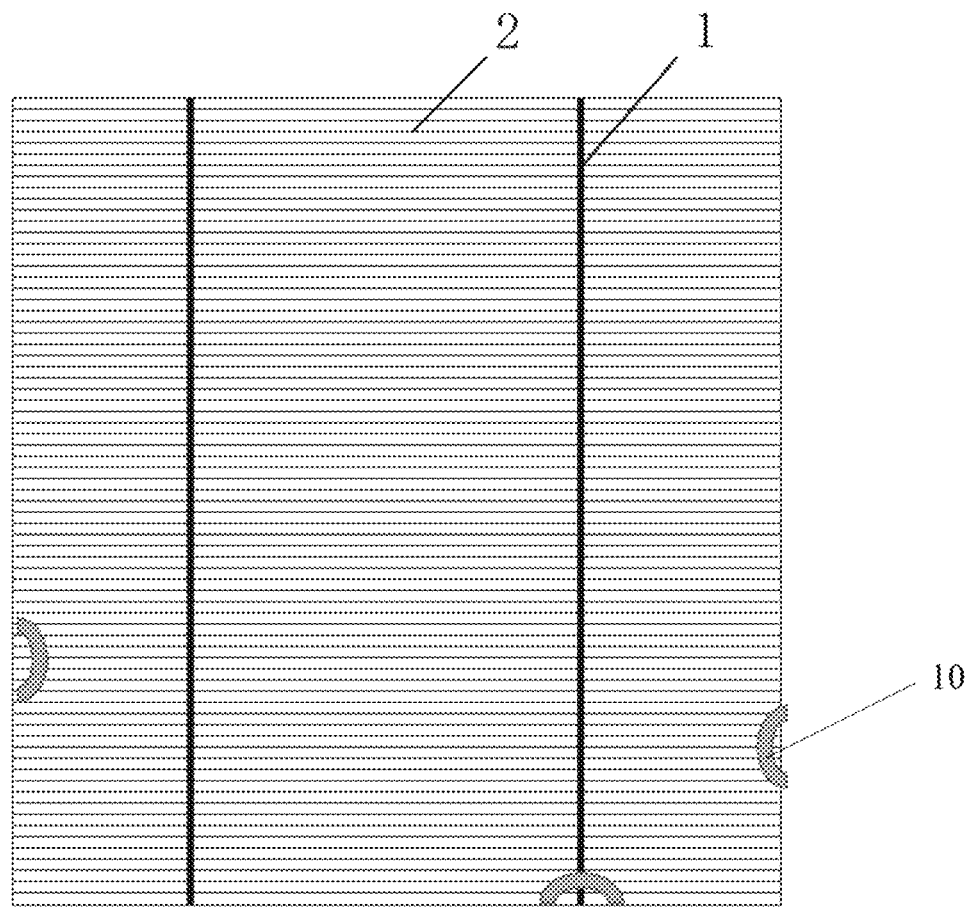
FIG. 2 is a schematic diagram of the rear surface structure of the bifacial tube-type PERC solar cell of FIG. 1.

FIG. 2 shows the rear surface of the silicon wafer. The rear aluminum grid lines 2 are perpendicularly connected to the rear silver major grind line 1. The rear silver major grid line 1 is a continuous straight grid line. As laser grooving regions are present at the rear surface composite film 3, during the printing of the rear aluminum grid lines 2, the aluminum paste fills the laser grooving regions and as a result, the rear aluminum grid lines 2 are in local contract with the P-type silicon, which allows the transmission of electrons to the rear aluminum grid lines 2 and the accumulation of electrons from the rear aluminum grid lines 2 at the rear silver major grid line 1 that intersects with the rear aluminum grid lines 2. Thus, it is understood that the rear aluminum grid lines 2 of the present invention could increase the open-circuit voltage Voc and the short-circuit current Jsc, reduce the recombination rate of the minority carriers, and transmit electrons. They are able to replace the aluminum back surface field of the existing monofacial cell and the minor grid lines of a rear silver electrode. Consequentially, they not only lower production cost by reducing the amount of silver paste and aluminum paste used, but also allows light absorption on both surfaces, which significantly expands the scope of application and improves the photoelectric conversion efficiency of a solar cell.

Apart from a continuous straight grid line as shown in FIG. 2, the rear silver major grid line 1 of the present invention could also be arranged in spaced segments. The adjacent segments are connected by a connecting line. There are 2-8 rear silver major grid lines 1, each with a width of 0.5-5 mm.

It should be noted that when two or more sets of laser grooving unit 9 are provided in each laser grooving region, they are arranged in parallel; the spacing between adjacent sets of laser grooving units 9 is 5-480 μm.

Each set of laser grooving unit 9 includes at least one laser grooving unit 9; the pattern of the laser grooving unit 9 is circular, elliptical, triangular, quadrangular, pentagonal, hexagonal, cruciform or star-shaped.

The width of the laser grooving region of the present invention is 10-500 μm; the width of the aluminum grid lines 2 located beneath the laser grooving region is larger than the width of the laser grooving region and is 30-550 μm. When the width of the aforementioned the aluminum grid lines 2 is relatively large (for example 500 μm) and the width of the laser grooving region is relatively small (for example 40 μm), it is possible to arrange multiple sets of laser grooving regions side by side on the same aluminum grid line 2 to ensure that the rear aluminum grid lines 2 have sufficient contact area with the P-type silicon 5.

It should be noted that the laser grooving units in the laser grooving regions may be parallel with or perpendicular to the aluminum grid lines.

The present invention employs a tubular PECVD device to deposit the rear surface composite film on the rear surface of the silicon wafer in order to produce the aforementioned bifacial PERC solar cell provided with aluminum grid lines. The tubular PERC device adopts a direct plasma method in which the plasma directly bombards the surface of the silicon wafer and causes significant passivation of the layer. As shown in FIGS. 3-8, the rear surface composite film 3 includes one or more films selected from the group comprising an aluminum oxide film, a silicon dioxide film, a silicon oxynitride film, and a silicon nitride film; it is deposited at the rear surface of the silicon wafer by a tubular PECVD device. The tubular PECVD device is provided with four gas lines of silane, ammonia, trimethyl aluminum, and nitrous oxide; the four gas lines are used alone or in combination to form the aluminum oxide film, the silicon dioxide film, the silicon oxynitride film, and the silicon nitride film. By adjusting the ratio of the gas flow, it is possible to obtain a silicon oxynitride film or a silicon nitride film having different composition ratios and refractive indexes. The order of formation and the thickness of the aluminum oxide film, the silicon dioxide film, the silicon oxynitride film, and the silicon nitride film are adjustable; the composition and refractive index of the silicon oxynitride film and the silicon nitride film are adjustable.

The four gas lines of silane, ammonia, trimethylaluminum, and nitrous oxide s can form different layers with different gas combinations, different gas flow ratios, and different deposition times. By adjusting the ratio of the gas flow, it is possible to obtain the silicon oxynitride film or the silicon nitride film having different composition ratios and refractive indexes. The combination order, thickness, and composition of the composite film can be flexibly adjusted, and therefore the production process of the present invention is flexible and controllable; furthermore, it is possible to reduce cost and obtain a large yield with this production process. In addition, the rear surface composite film is optimized to match the rear aluminum grid lines, which gives the best passivation effect and significantly increases the photoelectric conversion efficiency of the PERC cell.

The apparatus for loading and unloading silicon wafers in the tubular PECVD device is a graphite boat. The pin slot of the graphite boat has a depth of 0.5-1 mm. Preferably, the depth of the pin slot of the graphite boat is 0.6-0.8 mm; the diameter of a pin base is 6-15 mm; the angle of inclination of an inclined surface of a pin cap is 35-45 degrees; the thickness of the pin cap is 1-1.3 mm. More preferably, the pin slot of the graphite boat has a depth of 0.7-0.8 mm; the diameter of the pin base is 8-12 mm; the angle of inclination of an inclined surface of a pin cap is 35-40 degrees; the thickness of the pin cap is 1-1.2 mm.

When employing tubular PECVD for rear surface film deposition, it is difficult to prevent both scratching and undesirable coating. By adjusting an automatic wafer inserter, the silicon wafer can be inserted into the pin slot without contacting the graphite boat wall, during which the silicon wafer and the graphite boat are kept at a distance to avoid friction between the silicon wafer and the graphite boat wall. If the distance between the silicon wafer and the graphite boat plate were too large, scratching would be less likely to take place, but the possibility of the undesirable coating would increase as the silicon wafer would not be closely attached to the graphite boat wall. In addition, the large distance between the silicon wafer and the graphite boat wall may prevent the silicon wafer from properly inserting into the pin slot, and the silicon wafer may fall off as a result. If the distance between the silicon wafer and the graphite boat plate were too small, the silicon wafer would be closely attached to the graphite boat plate. As a result, undesirable coating would be less likely to take place, but the possibility of scratching would increase.

The position of the boat marks at the edges of the front surface of the cell corresponds to the positions of the pins during the rear surface coating by PECVD. These marks are formed as a result of gas flowing to the front surface of the cell from the position of the pins. The thickness of the pin base is slightly smaller than the thickness of the graphite boat plate, therefore there is a gap between the silicon wafer and the pin base at the position of the pins. When depositing the rear surface film, the gas enters the gap from two sides below the pin shaft, and then deposit a film at the front surface edges of the silicon wafer, i.e., forms semi-circular boat marks.

The present invention adjusts the diameters of the pin shaft and the pin base to reduce the depth of the inside of the pin slot. As a result, the gap between the silicon wafer and the pin base at the position of the pins is reduced; consequentially, the amount of gas reaching and coating the rear surface of the silicon wafer is reduced, boat marks at the front surface edges of the cell are thus much less likely to occur.

By adjusting the automatic wafer inserter, after inserting the silicon wafer into a certain position in the graphite boat, the suction cup releases its vacuum and thus the silicon wafer falls onto the inclined surface of the pin cap. Under the action of gravity, the silicon wafer slides down the inclined surface until it is closely attached to the graphite boat wall. This type of insertion is contactless can could reduce scratching of the silicon wafer.

The present invention adequately increases the angle of inclination of the inclined surface of the pin cap and the thickness of the pin cap, and adjusts the automatic wafer inserter, thereby slightly increasing the distance between the silicon wafer and the graphite boat wall, reducing scratching. Increasing the angle of inclination of the inclined surface of the pin cap also reduces the impact force on the silicon wafer from the graphite boat when the silicon wafer is sliding down the inclined surface, reducing breakage rate.

The tubular PECVD device employs the graphite boat for loading and unloading silicon wafers. Pin marks 10 are formed on the rear surface of the cell; 3-5 pin marks 10 are formed on the rear surface of the cell.

Figure 3:
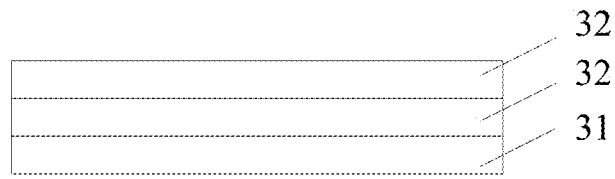
FIG. 3 is a schematic diagram of the first embodiment of the rear surface composite film of FIG. 1.
Figure 4:
FIG. 4 is a schematic diagram of the second embodiment of the rear surface composite film of FIG. 1.
Figure 5:
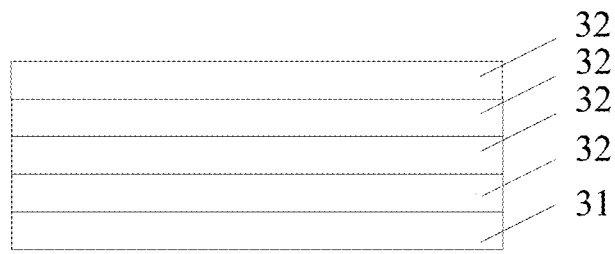
FIG. 5 is a schematic diagram of the third embodiment of the rear surface composite film of FIG. 1.

The rear surface composite film 3 has various embodiments. Referring to FIGS. 3, 4, and 5, the bottom layer of the rear surface composite film is an aluminum oxide film, and the top layer is composed of one or more films selected from the group consisting of a silicon dioxide film, a silicon oxynitride film, and a silicon nitride film.

In the first embodiment of the rear surface composite film shown in FIG. 3, the bottom layer 31 of the rear surface composite film 3 is an aluminum oxide film; the top layer 32 of the rear surface composite film is composed of a silicon oxynitride film and a silicon nitride film.

In the second embodiment of the rear surface composite film shown in FIG. 4, the bottom layer 31 of the rear surface composite film is an aluminum oxide film; the top layer 32 of the rear surface composite film is a silicon nitride film.

In the third embodiment of the rear surface composite film shown in FIG. 5, the bottom layer 31 of the rear surface composite film is an aluminum oxide film; the top layer 32 of the rear surface composite film is composed of a silicon dioxide film, a silicon oxynitride film A, a silicon oxynitride film B, and a silicon nitride film.

Figure 6:
FIG. 6 is a schematic diagram of the fourth embodiment of the rear surface composite film of FIG. 1.
Figure 7:
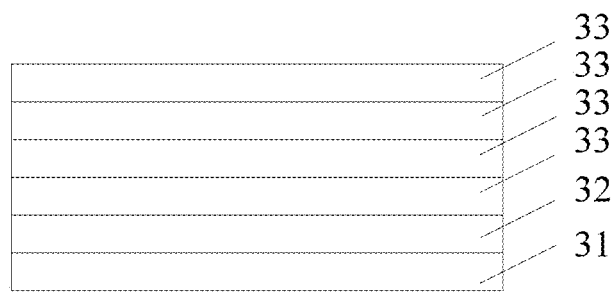
FIG. 7 is a schematic diagram of the fifth embodiment of the rear surface composite film of FIG. 1.
Figure 8:
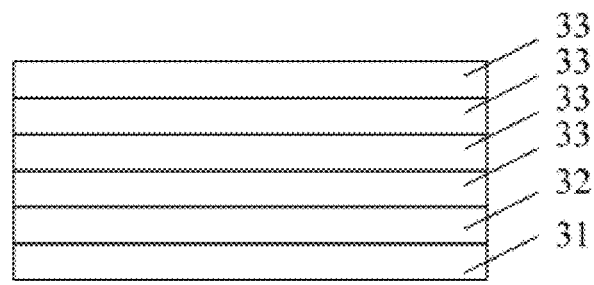
FIG. 8 is a schematic diagram of the sixth embodiment of the rear surface composite film of FIG. 1.

Referring to FIGS. 6, 7, and 8, the bottom layer 31 of the rear surface composite film is a silicon dioxide film; the middle layer 32 of the rear surface composite film is an aluminum oxide film; the top layer 33 is composed of one or more films selected from the group consisting of a silicon dioxide film, a silicon oxynitride film, and a silicon nitride film.

In the fourth embodiment of the rear surface composite film shown in FIG. 6, the bottom layer 31 of the rear surface composite film is a silicon dioxide film, the middle layer 32 of the rear surface composite film is an aluminum oxide film, and the top layer 33 of the rear surface composite film is a silicon nitride film.

In the fifth embodiment of the rear surface composite film shown in FIG. 7, the bottom layer 31 of the rear surface composite film is a silicon dioxide film, the middle layer 32 of the rear surface composite film is an aluminum oxide film, and the top layer 33 of the rear surface composite film is composed of a silicon dioxide film, a silicon oxynitride film A, a silicon oxynitride film B, and a silicon nitride film.

In the sixth embodiment of the rear surface composite film shown in FIG. 8, the bottom layer 31 of the rear surface composite film is a silicon dioxide film, the middle layer 32 of the rear surface composite film is an aluminum oxide film, and the top layer 33 is composed of a silicon dioxide film, a silicon oxynitride film, a silicon nitride film A, and a silicon nitride film B.

Specifically, the thickness of the aluminum oxide film is 5-15 nm, the thickness of the silicon nitride film is 50-150 nm, the thickness of the silicon oxynitride film is 5-20 nm, and the thickness of the silicon dioxide film is 1-10 nm. The actual thickness of the aluminum oxide film, the silicon nitride film, the silicon oxynitride film, and the silicon dioxide film may be adjusted according to actual needs; their embodiments are not limited to the embodiments described in the present invention.

To conclude, the bifacial tube-type PERC solar cell of the present invention can absorb sunlight on both surfaces. It has high photoelectric conversion efficiency, high appearance quality, and high EL yield; it solves the problems of both scratching and undesirable deposition.

It should be noted that EL (electroluminescence) is used for testing the appearance and the electrical performance of a cell. It is possible to use EL to check potential defects of crystalline silicon solar cells and its components. EL could effectively detect whether a cell has breakage, cracks, broken grids, scratches, firing defects, dark spots, mixing of different grades of cells, and inhomogeneous resistance of the cell, among others.

Accordingly, the present invention also discloses a method for preparing a bifacial tube-type PERC solar cell, comprising the following steps:

(1) Forming a textured surface on the front and rear surfaces of the silicon wafer, the silicon wafer is P-type silicon.

Using wet etching or dry etching techniques to form a textured surface on the surface of the silicon wafer by a texturing device.

(2) Performing diffusion on the silicon wafer to form an N-type emitter.

The diffusion process adopted by the preparation method of the present invention involves placing the silicon wafer in a thermal diffusion furnace for diffusion to form an N-type emitter on the P-type silicon. During diffusion, the temperature is kept within a range of 800° C. to 900° C. The target sheet resistance is 70-100 ohms/□.

At the rear surface of a tube-type PERC cell, the P-type silicon is only in contact with the aluminum paste only at the laser grooving regions instead of over the whole rear surface, which results in higher series resistance. In order to improve the performance of the tube-type PERC cell, the present invention adopts a lower diffusion sheet resistance (70-100 ohm/□), which reduces series resistance and increases photoelectric conversion efficiency.

During the diffusion process, phosphosilicate glass layers are formed on the front and rear surfaces of the silicon wafer. The phosphosilicate glass layers form as a result of the reaction between $POCl_3$ and $O_2$ to form a $P_2O_5$ deposition on the surface of the silicon wafer during the diffusion process. $P_2O_5$ reacts with Si to form $SiO_2$ and phosphorus atoms, thus a layer of $SiO_2$ containing phosphorus is formed on the surface of the silicon wafer, which is called phosphosilicate glass. The phosphosilicate glass layer could collect the impurities in the silicon wafer during diffusion and could further reduce the number of impurities in the solar cell.

(3) Removing the phosphosilicate glass on the front surface and peripheral p-n junctions formed during diffusion; polishing the rear surface of the silicon wafer; the depth of rear surface etching is 3-6 μm.

In the invention, the diffused silicon wafer is immersed in an acid bath of a mixed solution of HF (mass percentage 40%-50%) and $HNO_3$ (mass percentage 60%-70%) in a volume ratio of 1 to 5-8 for 5-30 seconds to remove the phosphosilicate glass and the peripheral p-n junctions. The phosphosilicate glass layer is likely to cause a color difference and cause $Si_xN_y$ to peel off in PECVD; in addition, the phosphosilicate glass layer contains a large amount of phosphorus and impurities migrated from the silicon wafer, and thus it is necessary to remove the phosphosilicate glass layer.

The etching depth of a conventional cell is about 2 μm. The present invention adopts a rear surface etching depth of 3 to 6 μm. By increasing the etching depth of the tube-type PERC cell, the reflectance of the rear surface, the short-circuit current, and the photoelectric conversion efficiency of the cell can be improved.

(4) performing annealing on the silicon wafer; the annealing temperature is 600-820° C., the nitrogen flow rate is 1-15 L/min, and the oxygen flow rate is 0.1-6 L/min; the annealing step improves the doping concentration distribution at the front surface of the silicon wafer, reducing surface defects caused by doping.

(5) depositing the rear surface composite film on the rear surface of the silicon wafer using a tubular PECVD device, including the following:

Depositing an aluminum oxide film using TMA and $N_2O$; the gas flow rate of TMA is 250-500 sccm, the ratio of TMA to $N_2O$ is 1 to 15-25; the plasma power is 2000-5000 W.

Depositing a silicon oxynitride film using silane, ammonia, and nitrous oxide; the gas flow rate of silane is 50-200 sccm, the ratio of silane to nitrous oxide is 1 to 10-80; the gas flow rate of ammonia is 0.1-5 slm, the plasma power is 4000-6000 W.

Depositing a silicon nitride film using silane and ammonia. The gas flow rate of silane is 500-1000 sccm; the ratio of silane to ammonia is 1 to 6-15; the deposition temperature of the silicon nitride film is 390-410° C.; the deposition time is 100-400 s; the plasma power is 10000-13000 W.

Depositing a silicon dioxide film using nitrous oxide. The gas flow rate of nitrous oxide is 0.1-5 slm; the plasma power is 2000-5000 W.

The tubular PECVD device is provided with four gas lines of silane, ammonia, trimethyl aluminum, and nitrous oxide. The apparatus for loading and unloading silicon wafers in the tubular PECVD device is a graphite boat. The pin slot of the graphite boat has a depth of 0.5-1 mm.

As a preferred embodiment of this step, depositing the rear surface composite film at the rear surface of the silicon wafer using a tubular PECVD device, including:

Depositing an aluminum oxide film using TMA and $N_2O$; the gas flow rate of TMA is 250-500 sccm, the ratio of TMA to $N_2O$ is 1 to 15-25; the deposition temperature of the aluminum oxide film is 250-300° C.; the deposition time is 50-300 s; the plasma power is 2000-5000 W.

Depositing a silicon oxynitride film using silane, ammonia, and nitrous oxide; the gas flow rate of silane is 50-200 sccm, the ratio of silane to nitrous oxide is 1 to 10-80; the gas flow rate of ammonia is 0.1-5 slm; the deposition temperature of the silicon oxynitride film is 350-410° C., the deposition time is 50-200 s; the plasma power is 4000-6000 W.

Depositing a silicon nitride film using silane and ammonia. The gas flow rate of silane is 500-1000 sccm; the ratio of silane to ammonia is 1 to 6-15; the deposition temperature of the silicon nitride film is 390-410° C.; the deposition time is 100-400 s; the plasma power is 10000-13000 W.

Depositing a silicon dioxide film using nitrous oxide. The flow rate of nitrous oxide is 0.1-5 slm; the plasma power is 2000-5000 W.

As a more preferred embodiment of this step, depositing the rear surface composite film at the rear surface of the silicon wafer using a tubular PECVD device, including:

Depositing an aluminum oxide film using TMA and $N_2O$; the gas flow rate of TMA is 350-450 sccm, the ratio of TMA to $N_2O$ is 1 to 18-22; the deposition temperature of the aluminum oxide film is 270-290° C.; the deposition time is 100-200 s; the plasma power is 3000-4000 W.

Depositing a silicon oxynitride film using silane, ammonia, and nitrous oxide; the gas flow rate of silane is 80-150 sccm, the ratio of silane to nitrous oxide is 1 to 20-40; the gas flow rate of ammonia is 1~4 slm; the deposition temperature for the silicon oxynitride film is 380-410° C., the deposition time is 100-200 s; the plasma power is 4500-5500 W.

Depositing a silicon nitride film using silane and ammonia. The gas flow rate of silane is 600-800 sccm; the ratio of silane to ammonia is 1 to 6-10; the deposition temperature of the silicon nitride film is 395-405° C.; the deposition time is 350-450 s; the plasma power is 11000-12000 W.

Depositing a silicon dioxide film using nitrous oxide. The flow rate of nitrous oxide is 1~4 slm; the plasma power is 3000-4000 W.

As the most preferred embodiment of this step, depositing the rear surface composite film at the rear surface of the silicon wafer using a tubular PECVD device, including:

Depositing an aluminum oxide film using TMA and $N_2O$; the gas flow rate of TMA is 400 sccm, the ratio of TMA to $N_2O$ is 1 to 18; the deposition temperature of the aluminum oxide film is 280° C.; the deposition time is 140 s; the plasma power is 3500 W.

Depositing an silicon oxynitride film using silane, ammonia, and nitrous oxide; the gas flow rate of silane is 130 sccm; the ratio of silane to nitrous oxide is 1 to 32; the gas flow rate of ammonia is 0.5 slm; the deposition temperature for the silicon oxynitride film is 420° C., the deposition time is 120 s; the plasma power is 5000 W.

Depositing a silicon nitride film using silane and ammonia. The gas flow rate of silane is 780 sccm; the ratio of silane to ammonia is 1 to 8.7; the deposition temperature of the silicon nitride film is 400° C.; the deposition time is 350 s; the plasma power is 11500 W.

Depositing a silicon dioxide film using nitrous oxide. The flow rate of nitrous oxide is 2 slm; the plasma power is 3500 W.

The applicant discovered that undesirable coating occurs primarily during the deposition of silicon nitride. This is because silicon nitride is the outer (top) layer of the rear surface composite film; as the deposition time increases, the thickness of the film increases, which causes the silicon wafer to bend. As a result, silane and ammonia are more likely to deposit to the front surface edge of the battery. By shortening the time and temperature of silicon nitride deposition, the bending of the silicon wafer can be reduced, and thus the amount of the undesirable coating can be reduced. Further experiments have shown that the temperature window for silicon nitride deposition is very narrow, between 390-410 degrees; when the temperature is further lowered, however, the amount of the undesirable coating increases.

When depositing the aluminum oxide film, the plasma power is set to 2000-5000 W; when depositing the silicon oxynitride film, the plasma power is set to 4000-6000 W; when depositing the silicon nitride film, the plasma power is set to 10000-13000 W; when depositing the silicon dioxide film, the plasma power is set to 2000-5000 W. This ensures that different layers have good deposition rates and improves deposition uniformity.

The tubular PECVD device is provided with four gas lines of silane, ammonia, trimethyl aluminum, and nitrous oxide. The apparatus for loading and unloading silicon wafers in the tubular PECVD device is a graphite boat. The pin slot of the graphite boat has a depth of 0.5-1 mm. The technical details of the graphite boat are the same as described above and will not be described in detail here.

(6) Depositing a passivation film on the front surface of the silicon wafer; the passivation film is preferably a silicon nitride film.

(7) Performing laser grooving at the rear surface composite film of the silicon wafer.

Laser grooving technique is used to groove the rear surface composite film of the silicon wafer; the depth of the groove reaches the rear surface of the P-type silicon. The laser wavelength is 532 nm, the laser power is above 14 W, the laser scribing speed is above 12 m/s, and the frequency is above 500 kHZ.

Preferably, the laser wavelength is 532 nm, the laser power is 14-20 W, the laser scribing speed is 12-20 m/s, and the frequency is 500 KHZ or more.

As the deposition time of silicon nitride is shortened, the thickness of the silicon nitride film is decreased, which affects the hydrogen passivation effect of the rear surface composite film layer and lowers the photoelectric conversion efficiency of the cell. Therefore, the silicon nitride deposition time cannot be too short. In addition, the thinner the silicon nitride film, the lower the absorption rate of the laser; meanwhile, in order to meet the requirements of large-scale production, the laser scribing speed must be kept at 12 m/s, and the laser power must be kept at above 14 W. As a result, the power and frequency of the laser must meet certain criteria in order to allow the absorption of a sufficiently large amount of laser energy in per unit area of the rear surface composite film to effectively groove the composite film, so that the aluminum paste subsequently printed is in contact with the silicon substrate through the laser grooving regions.

(8) Printing with a paste for rear silver major grid lines on the rear surface of the silicon wafer; drying.

Printing with a paste for rear silver major grid lines according to a pattern of rear silver major grid lines. The rear silver major grid lines are continuous straight grid lines; alternatively, the rear silver major grid lines are arranged in spaced segments, wherein the adjacent segments are connected by a connecting line.

(9) printing with aluminum paste at the laser grooving regions to form perpendicular connections with the paste for rear silver major grid lines.

(10) printing with paste for a positive electrode on the front surface of the silicon wafer.

(11) sintering the silicon wafer at a high temperature to form rear silver major grid lines, rear aluminum grid lines, and a front silver electrode.

(12) performing anti-LID annealing on the silicon wafer to obtain the bifacial tube-type PERC solar cell product.

The combination order, thickness, and composition of the composite film can be flexibly adjusted, and therefore the production process of the present invention is flexible, controllable, and is compatible with existing production lines. The bifacial tube-type PERC solar cell of the present invention can absorb sunlight on both surfaces. It has high photoelectric conversion efficiency, high appearance quality, and high EL yield; it solves the problems of both scratching and undesirable deposition.

Figure 9:
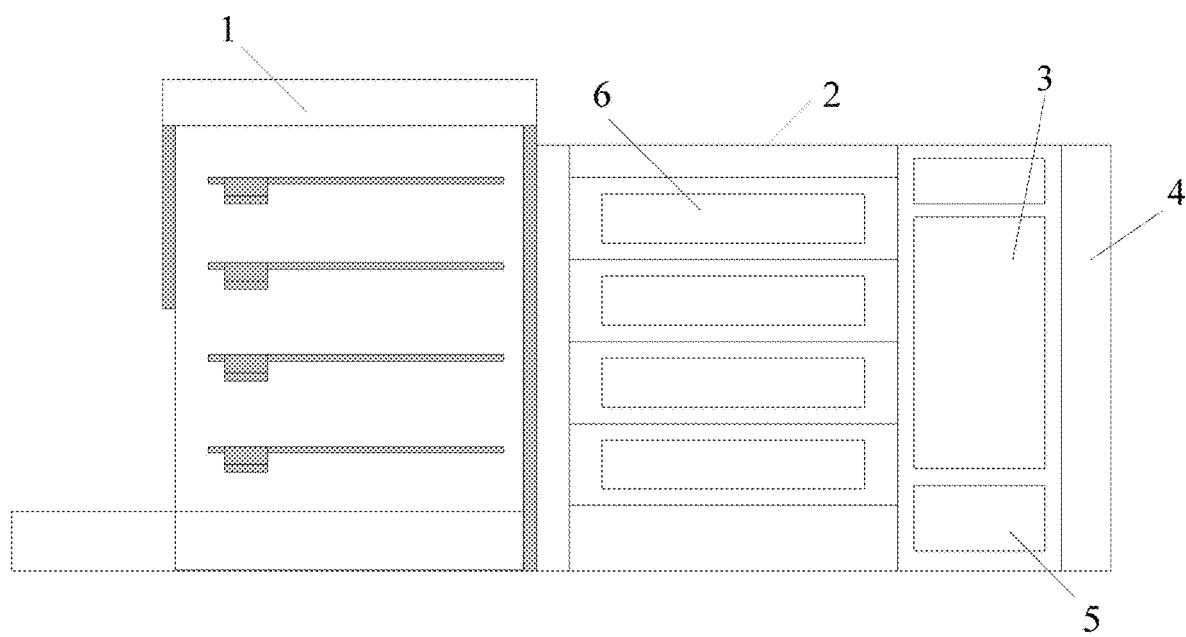
FIG. 9 is a schematic diagram of a device for producing the bifacial tube-type PERC solar cell of the present invention.

As shown in FIG. 9, the present invention also discloses a production device for the bifacial tube-type PERC solar cell. The device is a tubular PECVD device, which includes a silicon wafer loading area 1, a furnace body 2, a gas cabinet 3, a vacuum system 4, a control system 5, and a graphite boat 6. The gas cabinet 3 is provided with a first gas line for silane, a second gas line for ammonia, a third gas line for trimethylaluminum, and a fourth gas line for nitrous oxide. The first gas line, the second gas line, the third gas line, and the fourth gas line are provided inside the gas cabinet 3 and are is not shown in the drawing.

Figure 10:
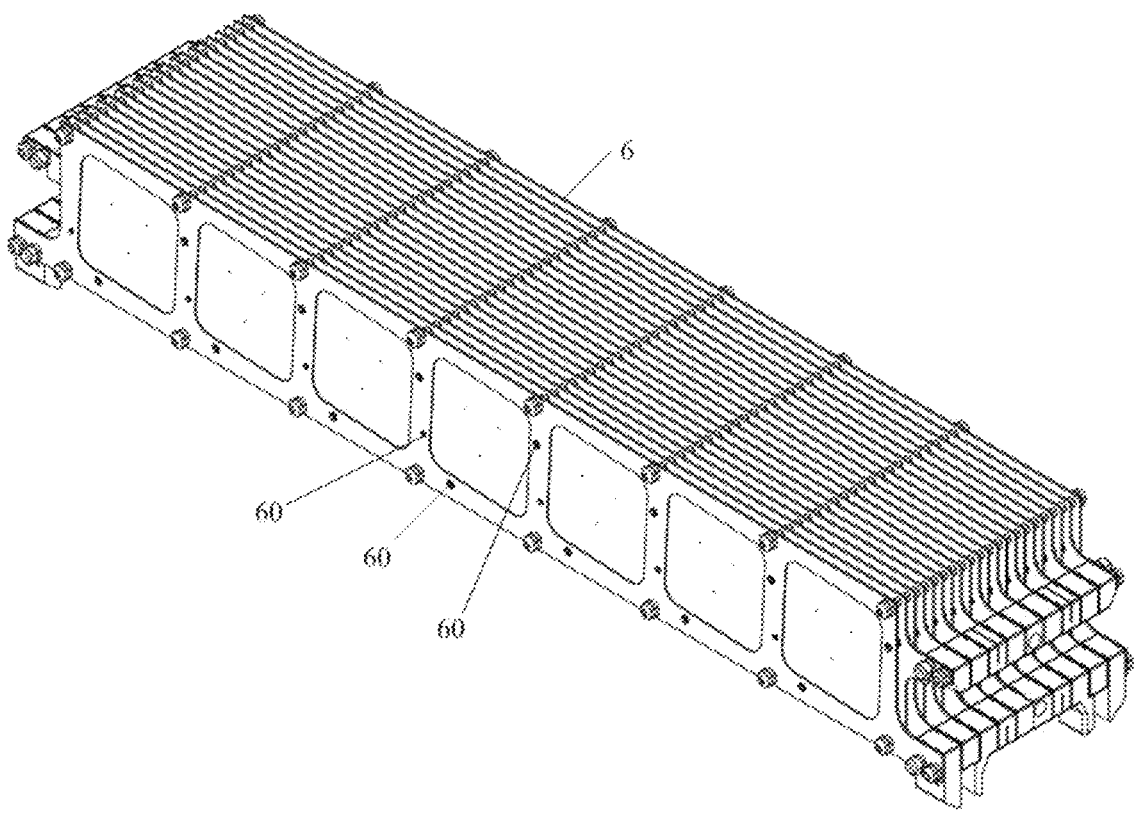
FIG. 10 is a schematic diagram of the graphite boat shown in FIG. 9.
Figure 11:
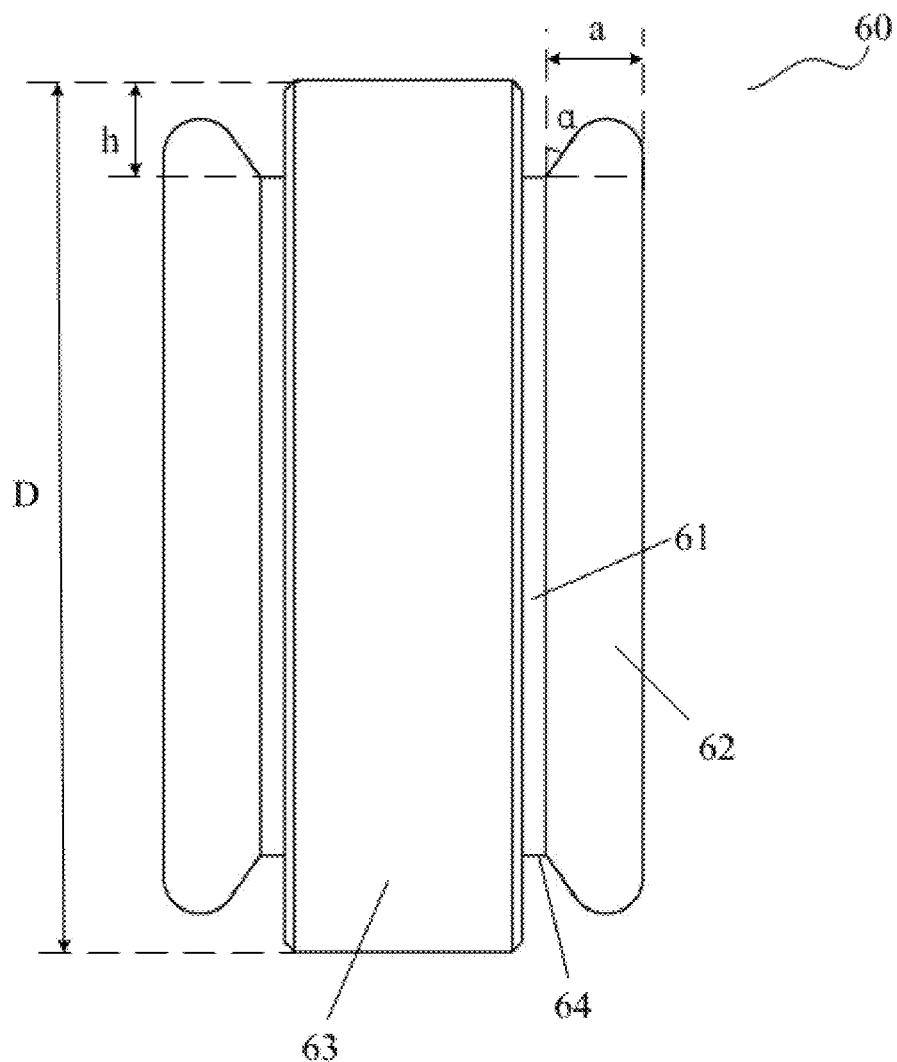
FIG. 11 is a schematic diagram of a pin of the graphite boat shown in FIG. 10.

As shown in FIGS. 10 and 11, the graphite boat 6 is used for loading and unloading silicon wafers. The graphite boat 6 includes a pin 60, and the pin 60 includes a pin shaft 61, a pin cap 62, and a pin base 63. The pin shaft 61 is mounted on the pin base 63. The pin cap 62 is connected to the pin shaft 61. A pin slot 64 is formed between the pin shaft 61, the pin cap 62, and the pin base 63. The depth of the pin slot 64 is 0.5-1 mm.

As shown in FIG. 11, the depth of the pin slot 64, h, is preferably 0.6-0.8 mm; the diameter of the pin base 63, D, is preferably 6-15 mm; the angle of inclination of the inclination surface of the pin cap 62, a, is preferably 35-45 degrees; the thickness of the pin cap 62, a, is preferably 1-1.3 mm.

More preferably, the depth of the pin slot 64, h, is 0.7 mm; the diameter of the pin base 63, D, is 9 mm; the angle of inclination of the inclination surface of the pin cap 62, a, is preferably 40 degrees; the thickness of the pin cap 62, a, is 1.2 mm.

It should be noted that the depth h of the pin slot is the depth of the inside of the pin slot, and mainly refers to the depth of the side of the pin shaft 61 that forms an angle with and the pin base 63. The depth h of the pin slot=(the diameter of the pin base−the diameter of the pin shaft)/2. The angle of inclination of the inclination surface of the pin cap 62, $\alpha$, refers to the angle between the inclination surface of the pin cap and the vertical direction.

In the prior art, the depth h of the pin slot is 1.75 mm, the diameter D of the pin base is 9 mm, the angle of inclination $\alpha$ of the pin cap is 30 degrees, and the thickness a of the pin cap is 1 mm. In the prior art, the pin slot is deeper, which leads to too big a gap between the silicon wafer and the pin base at the position of the pins; as a result, a lot of gas is present at the rear surface of the silicon wafer, leading to the formation of a large number of boat marks at the front surface edges of the cell. The pin cap has a small angle of inclination and a small thickness, leading to small adjustment room for the automatic wafer inserter; consequentially, it is difficult to effectively lower the occurrence of scratching.

When employing tubular PECVD for rear surface film deposition, it is difficult to prevent both scratching and undesirable coating. By adjusting an automatic wafer inserter, the silicon wafer can be inserted into the pin slot without contacting the graphite boat wall, during which the silicon wafer and the graphite boat are kept at a distance to avoid friction between the silicon wafer and the graphite boat wall. If the distance between the silicon wafer and the graphite boat plate were too large, scratching would be less likely to take place, but the possibility of the undesirable coating would increase as the silicon wafer would not be closely attached to the graphite boat wall. In addition, the large distance between the silicon wafer and the graphite boat wall may prevent the silicon wafer from properly inserting into the pin slot, and the silicon wafer may fall off as a result. If the distance between the silicon wafer and the graphite boat plate were too small, the silicon wafer would be closely attached to the graphite boat plate. As a result, undesirable coating would be less likely to take place, but the possibility of scratching would increase.

The position of the boat marks at the edges of the front surface of the cell corresponds to the positions of the pins during the rear surface coating by PECVD. These marks are formed as a result of gas flowing to the front surface of the cell from the position of the pins. The thickness of the pin base is slightly smaller than the thickness of the graphite boat plate, therefore there is a gap between the silicon wafer and the pin base at the position of the pins. When depositing the rear surface film, the gas enters the gap from two sides below the pin shaft, and then deposit a film at the front surface edges of the silicon wafer, i.e., forms semi-circular boat marks.

The present invention adjusts the diameter D of the pin base and the diameter of the pin shaft to reduce the depth h of the inside of the pin slot. As a result, the gap between the silicon wafer and the pin base at the position of the pins is reduced; consequentially, the amount of gas reaching and coating the rear surface of the silicon wafer is reduced, boat marks at the front surface edges of the cell are thus much less likely to occur.

By adjusting the automatic wafer inserter, after inserting the silicon wafer into a certain position in the graphite boat, the suction cup releases its vacuum and thus the silicon wafer falls onto the inclined surface $\alpha$ of the pin cap. Under the action of gravity, the silicon wafer slides down the inclined surface until it is closely attached to the graphite boat wall. This type of insertion is contactless can could reduce scratching of the silicon wafer.

The present invention adequately increases the angle of inclination $\alpha$ of the inclined surface of the pin cap and the thickness of the pin cap, and adjusts the automatic wafer inserter, thereby slightly increasing the distance between the silicon wafer and the graphite boat wall, reducing scratching. Increasing the angle of inclination of the inclined surface of the pin cap also reduces the impact force on the silicon wafer from the graphite boat when the silicon wafer is sliding down the inclined surface, reducing breakage rate.

It should be noted that in the prior art, the problem of undesirable etching is generally only tackled after the production is completed. For example, in the alkali polishing method during the production of PERC crystalline silicon solar cells disclosed in Chinese patent application No. 201510945459.3, after coating a silicon nitride film on the front surface by PECVD, the undesirable silicon nitride coating at the rear surface and the edges are removed by a belt-type transmission etching method, thereby solving the problems of poor passivation at the rear surface due to undesirable etching. However, in the tube-type PERC cell of the present application, the silicon nitride film is coated on the rear surface and undesirable coating takes place at the front surface; p-n junctions present on the front surface would be destroyed if the alkali polishing method of the above patent were used. By adjusting the coating process and the coating structure, the invention avoids undesirable coating during the production process and solves the problem of undesirable coating from its root. No additional process is required, which simplifies the overall process and reduces production cost. The invention is of great importance for the solar photovoltaic industry, which is extremely cost sensitive. Moreover, the present invention also solves the problem of scratching.

In summary, the present invention has the following beneficial effects:

First, the bifacial tube-type PERC solar cell of the present invention has a plurality of aluminum grid lines arranged in parallel at the rear surface of the cell. These aluminum grid lines not only replace the aluminum back surface field in an existing monofacial solar cell to allow light absorption on the rear surface, but also act as minor grid lines of a rear silver electrode for electron conduction. The bifacial tube-type PERC solar cell of the present invention not only lowers production cost by reducing the amount of silver paste and aluminum paste used, but also allows light absorption on both surfaces, which significantly expands the scope of application and improves the photoelectric conversion efficiency of a solar cell.

Second, the present invention employs a tubular PECVD device to deposit the rear surface composite film on the rear surface of the silicon wafer in order to produce the aforementioned bifacial PERC solar cell provided with aluminum grid lines. The rear surface composite film includes one or more films selected from the group comprising an aluminum oxide film, a silicon dioxide film, a silicon oxynitride film, and a silicon nitride film, and is deposited at the rear surface of the silicon wafer by a tubular PECVD device. The tubular PERC device adopts a direct plasma method in which the plasma directly bombards the surface of the silicon wafer and causes significant passivation of the layer. The tubular PECVD device is provided with four gas lines of silane, ammonia, trimethyl aluminum, and nitrous oxide; the four gas lines are used alone or in combination to form the aluminum oxide film, the silicon dioxide film, the silicon oxynitride film, and the silicon nitride film. By adjusting the ratio of the gas flow of the four gas lines, it is possible to obtain different films. In particular, it is possible to obtain a silicon oxynitride film or a silicon nitride film having different composition ratios and refractive indexes by adjusting the ratio of the gas flow. The combination order, thickness, and composition of the composite film can be flexibly adjusted, and therefore the production process of the present invention is flexible and controllable; furthermore, it is possible to reduce cost and obtain a large yield with this production process. In addition, the rear surface composite film is optimized to match the rear aluminum grid lines, which gives the best passivation effect and significantly increases the photoelectric conversion efficiency of the PERC cell.

Third, the present invention adjusts the diameters of the pin shaft and the pin base to reduce the depth of the inside of the pin slot. As a result, the gap between the silicon wafer and the pin base at the position of the pins is reduced; consequentially, the amount of gas reaching and coating the rear surface of the silicon wafer is reduced, boat marks at the front surface edges of the cell are thus much less likely to occur. In addition, the present invention adequately increases the angle of inclination of the inclined surface of the pin cap and the thickness of the pin cap, and adjusts the automatic wafer inserter, thereby slightly increasing the distance between the silicon wafer and the graphite boat wall, reducing scratching. Increasing the angle of inclination of the inclined surface of the pin cap also reduces the impact force on the silicon wafer from the graphite boat when the silicon wafer is sliding down the inclined surface, reducing breakage rate.

Furthermore, silicon nitride is the outer layer of the rear surface composite film; as the deposition time increases, the thickness of the film increases, which causes silicon wafer to bend. In the present invention, the silicon nitride deposition temperature is limited to 390-410° C., the deposition time is limited to 100-400 s. By shortening the time and temperature of silicon nitride deposition, the bending of the silicon wafer can be reduced, and thus the amount of the undesirable coating can be reduced. The temperature window for silicon nitride deposition is very narrow, between 390-410 degrees; this temperature allows the maximum reduction of the undesirable coating. When the temperature is further lowered, however, the amount of the undesirable coating increases.

To meet the requirements of large-scale production and minimize the negative impact caused by shortening the silicon nitride deposition time, the present invention maintains a laser power of above 14 W, a laser scribing speed of above 12 m/s, and a frequency of above 500 kHZ. This allows the absorption of a sufficiently large amount of laser energy in per unit area of the rear surface composite film to effectively groove the composite film; as a result, the aluminum paste subsequently printed is in contact with the silicon substrate through the laser grooving regions.

To conclude, the bifacial tube-type PERC solar cell of the present invention can absorb sunlight on both surfaces. It has high photoelectric conversion efficiency, high appearance quality, and high EL yield; it solves the problems of both scratching and undesirable deposition. In addition, the present invention also provides a method and a device for the production of the aforementioned cell. The production method of the present invention is simple, can be carried out at a large scale, and is compatible with existing production lines. The device has a simple structure, is able to lower production cost, and has large capacity and yield.

It should be noted that the above embodiments are only intended to illustrate the technical solutions of the present invention and are not intended to limit the scope of the present invention. Although the present invention has been described in detail with reference to the preferred embodiments, the technical solutions of the present invention may be modified or equivalently substituted without departing from the spirit and scope of the technical solutions of the present invention.

What is claimed is:

1. A method of preparing the bifacial PERC solar cell, wherein it comprises the following steps:
    S101: forming a textured surface on a front surface and a rear surface of the silicon wafer, the silicon wafer is the P-type silicon;
    S102: performing diffusion on the silicon wafer to form the N-type emitter;
    S103: removing phosphosilicate glass and peripheral p-n junctions formed during the diffusion; polishing the rear surface of the silicon wafer;
    S104: performing annealing on the silicon wafer;
    S105: depositing the rear surface composite film on the rear surface of the silicon wafer, the tubular PECVD device is provided with four gas lines of silane, ammonia, trimethyl aluminum, and nitrous oxide; the graphite boat is employed to load and unload the silicon wafer in the tubular PECVD device; the pin slot of the graphite boat has a depth of 0.5-1 mm;
    S106: depositing a passivation film on the front surface of the silicon wafer;
    S107: performing laser grooving at the rear surface of the silicon wafer;
    S108: printing with a paste for the rear silver major grid line on the rear surface of the silicon wafer; drying;
    S109: printing with aluminum paste at the laser grooving regions to perpendicularly connect with the paste for the rear silver major grid lines;
    S110: printing with positive electrode slurry on the front surface of the silicon wafer;
    S111: sintering the silicon wafer at a high temperature to form the rear silver major grid line, the rear aluminum grid lines, and the front silver electrode;
    S112: performing anti-LID annealing on the silicon wafer to obtain the bifacial PERC solar cell.

2. The method according to claim 1, wherein depositing the rear surface composite film on the rear surface of the silicon wafer includes the following:
    depositing the aluminum oxide film using TMA and $N_2O$; a gas flow rate of TMA is 250-500 sccm, a ratio of TMA to $N_2O$ is 1 to 15-25; a plasma power is 2000-5000 W;
    depositing the silicon oxynitride film using silane, ammonia, and nitrous oxide; a gas flow rate of silane is 50-200 sccm, a ratio of silane to nitrous oxide is 1 to 10-80; a gas flow rate of ammonia is 0.1-5 slm, the plasma power is 4000-6000 W;
    depositing the silicon nitride film using silane and ammonia; the gas flow rate of silane is 500-1000 sccm; a ratio of silane to ammonia is 1 to 6-15; a deposition temperature of the silicon nitride film is 390-410° C.; a deposition time is 100-400 s; the plasma power is 10000-13000 W;
    depositing a silicon dioxide film using nitrous oxide; a gas flow rate of nitrous oxide is 0.1-5 slm; the plasma power is 2000-5000 W.

3. The method according to claim 2, wherein depositing the rear surface composite film on the rear surface of the silicon wafer includes the following:
    depositing the aluminum oxide film using TMA and $N_2O$; the gas flow rate of TMA is 250-500 sccm, the ratio of TMA to $N_2O$ is 1 to 15-25; the plasma power is 2000-5000 W;
    depositing the silicon oxynitride film using silane, ammonia, and nitrous oxide; the gas flow rate of silane is 50-200 sccm, the ratio of silane to nitrous oxide is 1 to 10-80; the gas flow rate of ammonia is 0.1-5 slm, the plasma power is 4000-6000 W;
    depositing the silicon nitride film using silane and ammonia; the gas flow rate of silane is 500-1000 sccm; the ratio of silane to ammonia is 1 to 6-15; the deposition temperature of the silicon nitride film is 390-410° C.; the deposition time is 100-400 s; the plasma power is 10000-13000 W;
    depositing a silicon dioxide film using nitrous oxide; the gas flow rate of nitrous oxide is 0.1-5 slm; the plasma power is 2000-5000 W.

4. The bifacial PERC solar cell according to claim 2, wherein a thickness of the aluminum oxide film is 5-15 nm, a thickness of the silicon nitride film is 50-150 nm, a thickness of the silicon oxynitride film is 5-20 nm, and a thickness of the silicon dioxide film is 1-10 nm.

5. The method according to claim 1, wherein the pin slot of the graphite boat has a depth of 0.6-0.8 mm; a diameter of a pin base is 6-15 mm, an angle of inclination of an inclined surface of a pin cap is 35-45 degrees; a thickness of the pin cap is 1-1.3 mm.

6. The method according to claim 1, wherein 3-5 pin marks are formed on the rear surface of the bifacial PERC solar cell.

7. The method according to claim 1, wherein step S107, a laser wavelength is 532 nm, a laser power is above 14 W, a laser scribing speed is above 12 m/s, and a frequency is above 500 kHZ.

8. The method according to claim 1, wherein step S103, the depth of rear surface etching is 3-6 μm.

9. The method according to claim 1, wherein step S104, an annealing temperature is 600-820° C., a nitrogen flow rate is 1-15 L/min, and an oxygen flow rate is 0.1-6 L/min.

* * * * *